United States Patent
Mueller et al.

(10) Patent No.: US 9,576,872 B2
(45) Date of Patent: Feb. 21, 2017

(54) SEMICONDUCTOR DEVICES AND METHODS FOR MANUFACTURING SEMICONDUCTOR DEVICES

(71) Applicant: Infineon Technologies AG, Neubiberg (DE)

(72) Inventors: Thomas Mueller, Lappersdorf (DE); Horst Theuss, Wenzenbach (DE)

(73) Assignee: Infineon Technologies AG, Neubiberg (DE)

(*) Notice: Subject to any disclaimer, the term of this patent is extended or adjusted under 35 U.S.C. 154(b) by 28 days.

(21) Appl. No.: 14/132,296

(22) Filed: Dec. 18, 2013

(65) Prior Publication Data

US 2015/0170987 A1 Jun. 18, 2015

(51) Int. Cl.
*H01L 23/28* (2006.01)
*H01L 23/31* (2006.01)
*H01L 21/56* (2006.01)

(52) U.S. Cl.
CPC ........ *H01L 23/3114* (2013.01); *H01L 21/561* (2013.01); *H01L 23/3157* (2013.01); *H01L 21/568* (2013.01); *H01L 2224/11* (2013.01); *H01L 2924/0002* (2013.01)

(58) Field of Classification Search
CPC ......................... H01L 23/3121; H01L 23/3157
USPC ....................................................... 257/787
See application file for complete search history.

(56) References Cited

U.S. PATENT DOCUMENTS

| | | | | |
|---|---|---|---|---|
| 4,323,914 A | * | 4/1982 | Berndlmaier et al. | 257/713 |
| 4,703,338 A | * | 10/1987 | Sagami et al. | 257/788 |
| 5,653,019 A | * | 8/1997 | Bernhardt et al. | 29/840 |
| 7,569,427 B2 | * | 8/2009 | Theuss | 438/127 |
| 7,687,895 B2 | * | 3/2010 | Brunnbauer et al. | 257/685 |
| 8,513,096 B2 | * | 8/2013 | Shimotani et al. | 438/462 |
| 2001/0018229 A1 | | 8/2001 | Kato et al. | |
| 2002/0031868 A1 | * | 3/2002 | Capote | H01L 21/563 438/126 |
| 2003/0069331 A1 | * | 4/2003 | Teiichi et al. | 523/176 |
| 2005/0017374 A1 | * | 1/2005 | Kiendl | H01L 21/561 257/778 |
| 2006/0183349 A1 | * | 8/2006 | Farnworth et al. | 438/792 |
| 2006/0223284 A1 | | 10/2006 | Li et al. | |
| 2007/0273046 A1 | * | 11/2007 | Theuss | H01L 21/561 257/783 |
| 2008/0265383 A1 | * | 10/2008 | Brunnbauer | H01L 21/561 257/659 |
| 2009/0001487 A1 | * | 1/2009 | Mizuno | B81B 7/0038 257/415 |
| 2009/0191665 A1 | | 7/2009 | Nikitin et al. | |
| 2010/0003791 A1 | * | 1/2010 | Maeda | H01L 51/0022 438/158 |

(Continued)

FOREIGN PATENT DOCUMENTS

DE 102005053842 A1 6/2007
WO WO2014032702 A1 * 3/2014 ............. H01L 33/44

*Primary Examiner* — Andy Huynh
*Assistant Examiner* — Sitaramarao S Yechuri
(74) *Attorney, Agent, or Firm* — Murphy, Bilak & Homiller, PLLC

(57) ABSTRACT

A method includes arranging multiple semiconductor chips over a first carrier and depositing a first material layer over surfaces of the multiple semiconductor chips, wherein depositing the first material layer includes a vapor deposition, and wherein the first material layer includes at least one of an organic material and a polymer.

21 Claims, 9 Drawing Sheets

(56) References Cited

U.S. PATENT DOCUMENTS

2010/0314637 A1* 12/2010 Kim et al. ................ 257/88
2011/0241222 A1    10/2011 Sezi et al.
2012/0193662 A1*  8/2012 Donofrio ............... H01L 33/60
                                                         257/98
2012/0295085 A1* 11/2012 Iida ....................... B32B 27/34
                                                        428/212
2012/0313243 A1* 12/2012 Chang .................... H01L 24/19
                                                        257/738
2013/0217189 A1*  8/2013 Sasaki et al. ............. 438/118

* cited by examiner

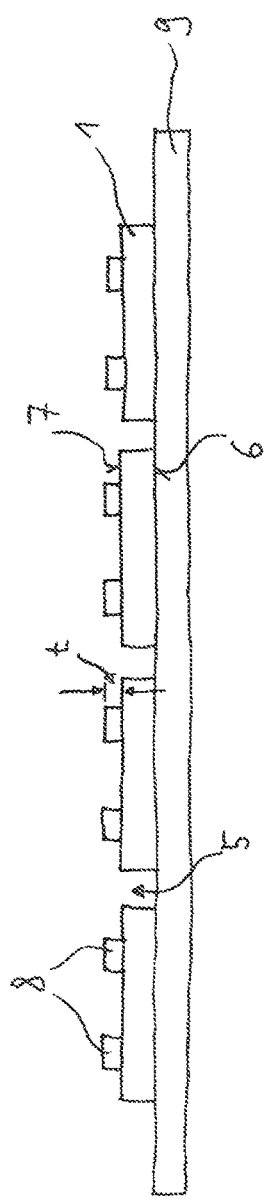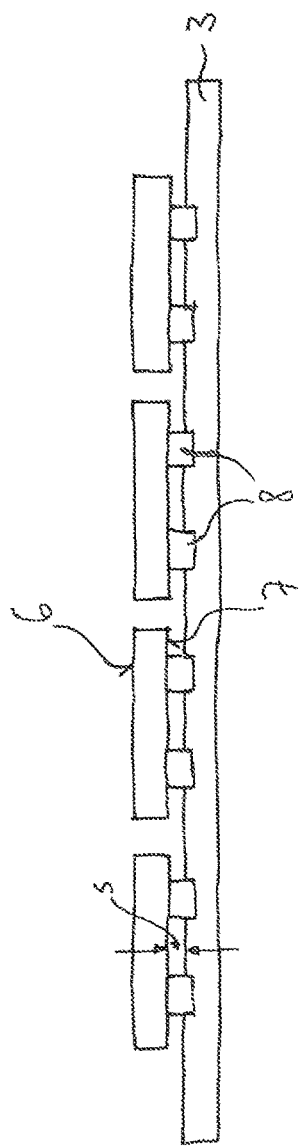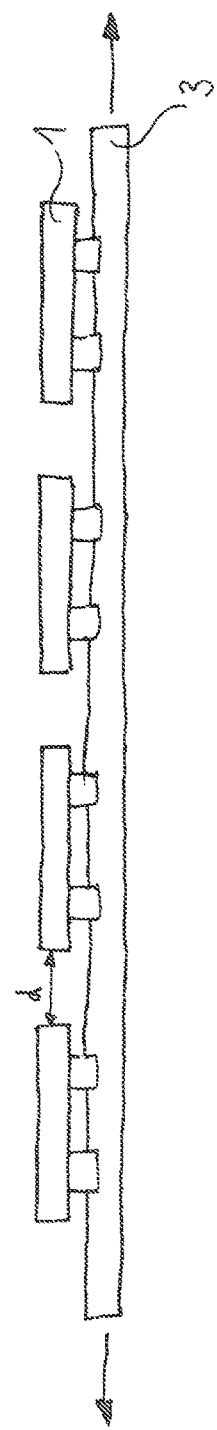

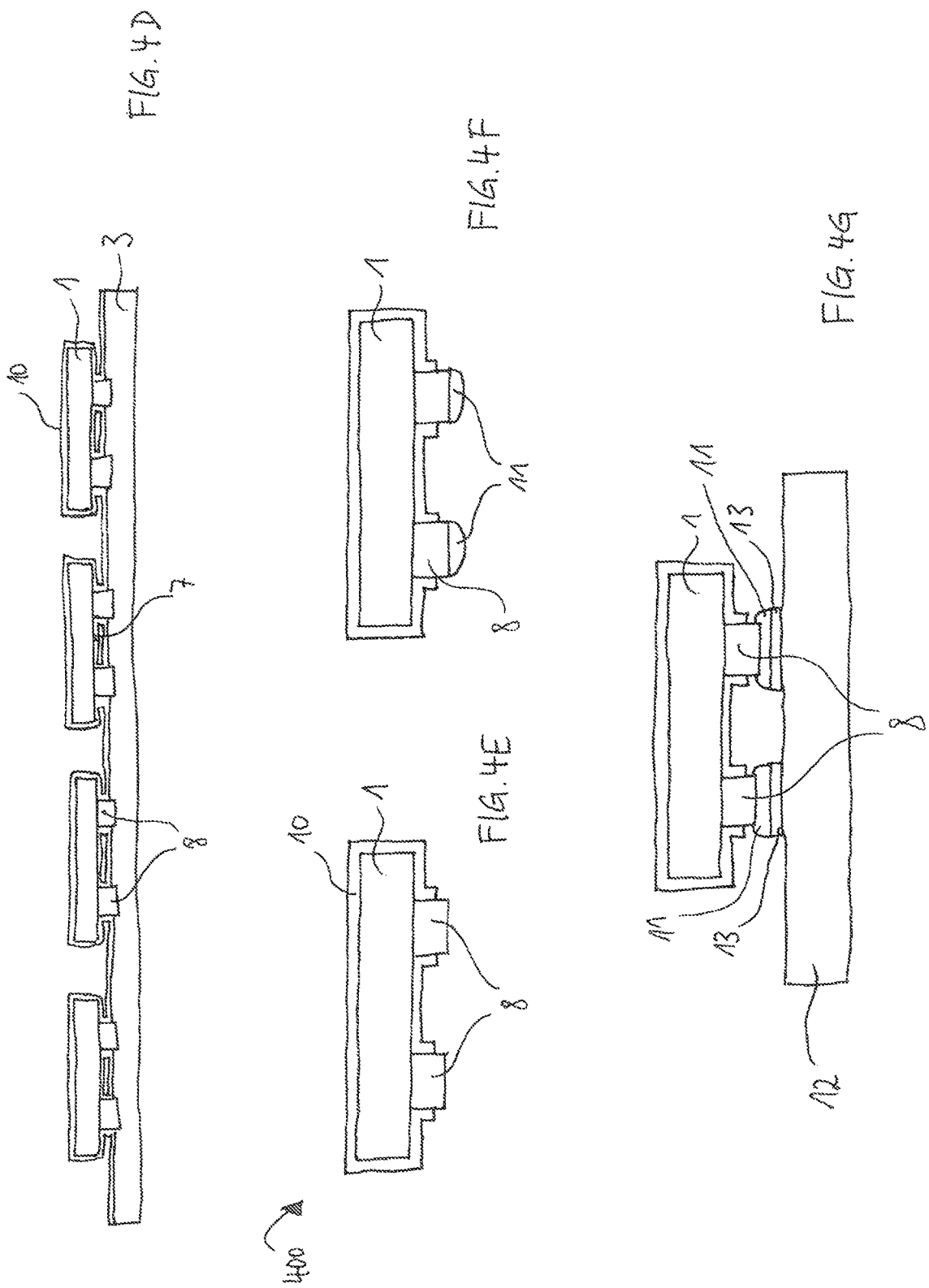

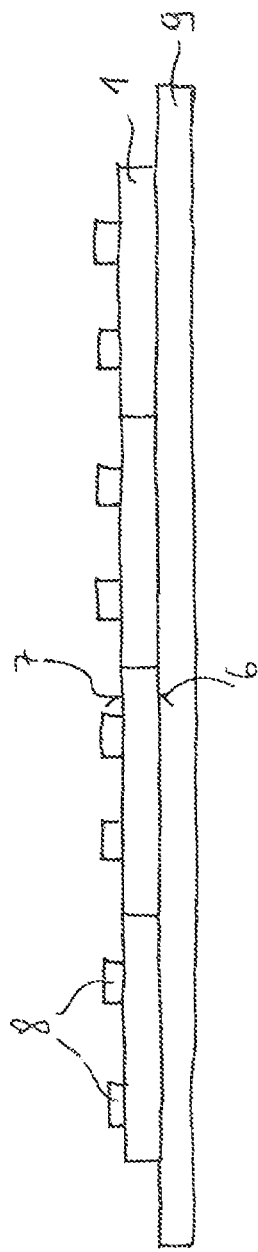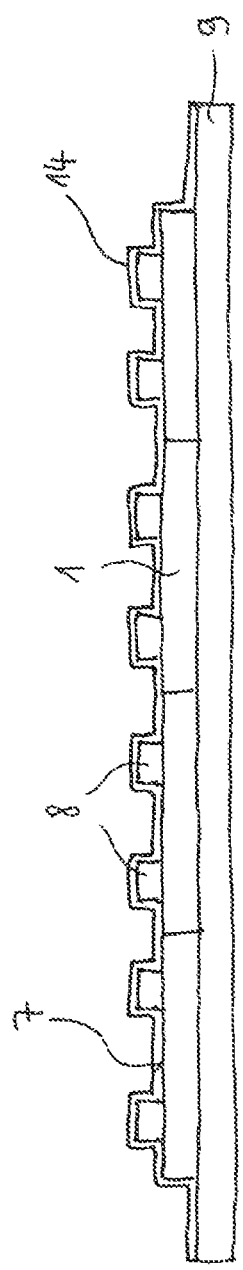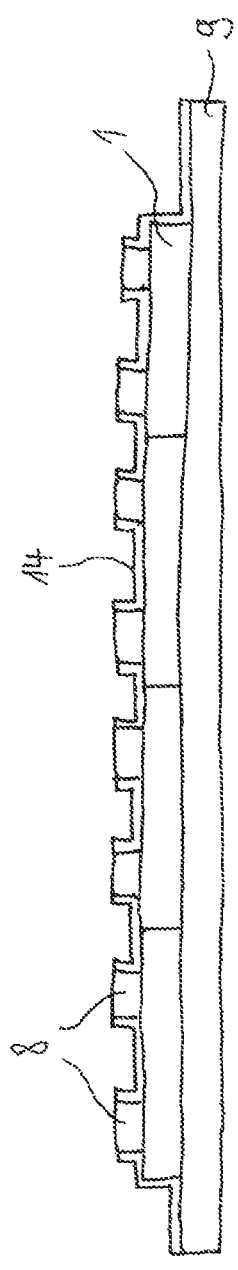

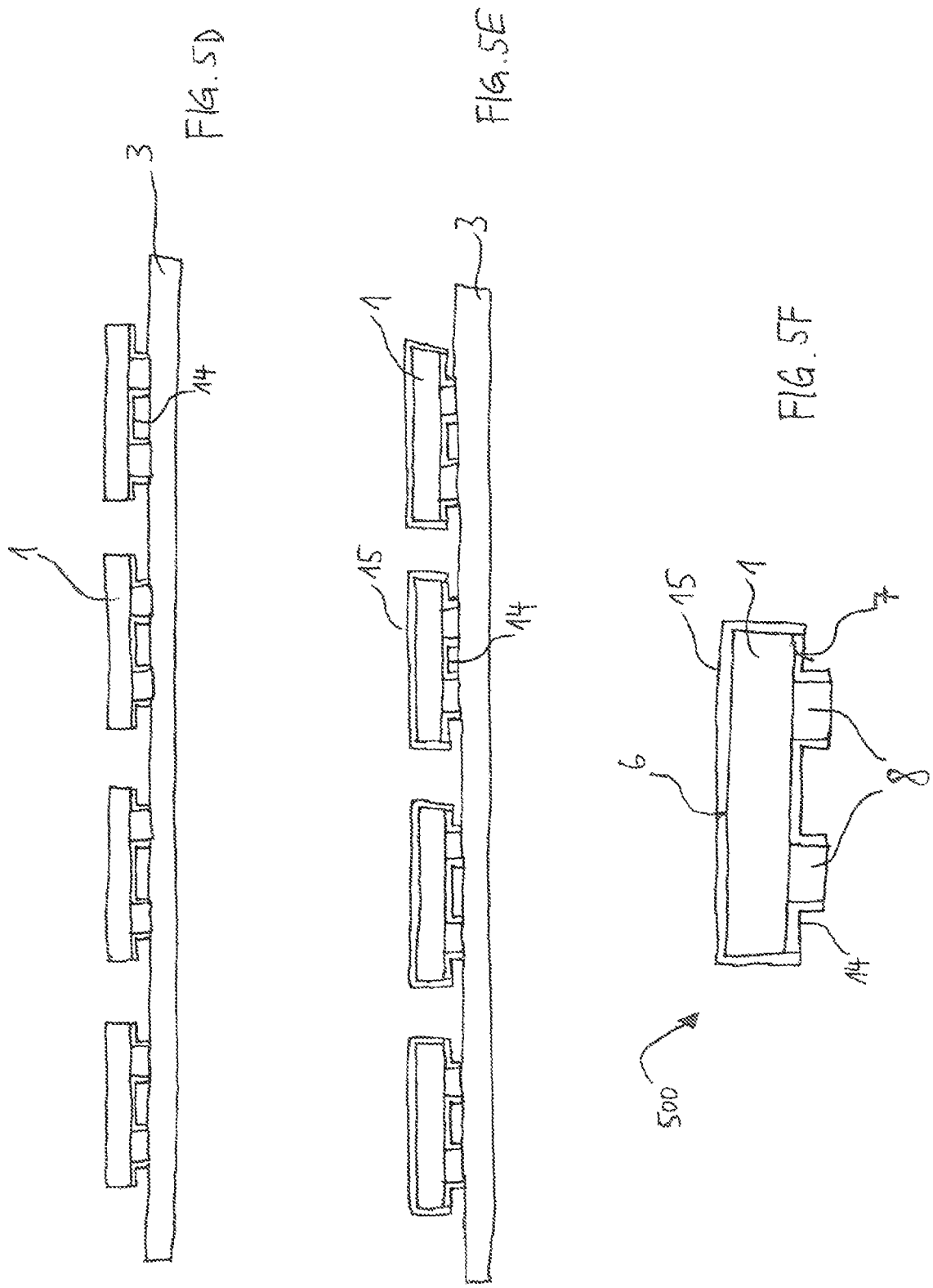

SEMICONDUCTOR DEVICES AND METHODS FOR MANUFACTURING SEMICONDUCTOR DEVICES

TECHNICAL FIELD

The disclosure relates to semiconductor devices and methods for manufacturing semiconductor devices. In particular, the disclosure relates to methods including an act of depositing one or more material layers over semiconductor chips that may be included in a semiconductor device.

BACKGROUND

A semiconductor device may be damaged during its production and operation. Semiconductor devices and methods for manufacturing semiconductor devices constantly have to be improved. It may be desirable to improve the quality of semiconductor devices and the methods for manufacturing the same. In particular, it may be desirable to prevent semiconductor devices from being damaged during production and operation. In addition, it may be desirable to reduce the production costs of methods for manufacturing the semiconductor devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

FIGS. 4A to 4G schematically illustrate a cross-sectional view of a method for manufacturing a semiconductor device in accordance with the disclosure.

FIGS. 5A to 5F schematically illustrate a cross-sectional view of a method for manufacturing a semiconductor device in accordance with the disclosure.

DETAILED DESCRIPTION

Figure 1:
FIG. 1 schematically illustrates a cross-sectional view of a semiconductor device in accordance with the disclosure.

In the following detailed description, reference is made to the accompanying drawings, which form a part hereof, and in which is shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in noway limiting. Other aspects may be utilized and structural or logical changes may be made without departing from the scope of the present disclosure. Hence, the following detailed description is not to be taken in a limiting sense, and the scope of the present disclosure is defined by the appended claims.

As employed in this specification, the terms "connected", "coupled", "electrically connected" and/or "electrically coupled" are not meant to necessarily mean that the elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such an act is not explicitly described or illustrated in the figures. In addition, the features of the various exemplary aspects described herein may be combined with each other, unless specifically noted otherwise.

The semiconductor devices in accordance with the disclosure may include one or more semiconductor chips that may at least partly be manufactured from semiconductor material. The semiconductor chips need not be manufactured from a specific semiconductor material (e.g. Si, SiC, SiGe, GaAs, etc.) and may contain inorganic and/or organic materials that are not semiconductors (e.g. insulators, plastics, metals, etc.). The semiconductor chips may be of arbitrary size. A surface area of an active frontside of the semiconductor chip may lie in a range from about 0.05 mm$^2$ or even smaller to about 15 mm$^2$ or even larger. In particular, a surface area of an active frontside of the semiconductor chip may be smaller than 1 mm$^2$. In one example, a semiconductor chip may have dimensions in terms of length×width×height which may be larger than or equal to 0.4 mm×0.2 mm×0.2 mm.

The semiconductor chips may be of different type and may be manufactured on the basis of different technologies. In one example, the semiconductor chips may correspond to discrete semiconductor chips such as e.g. diodes, transistors, rectifiers, thyristors, etc. In a further example, the semiconductor chips may include integrated circuits containing at least one of passive electronic components, active electronic components, electrical components, electrooptical components, electromechanical components, etc. The integrated circuits may be designed as logic integrated circuits, analog integrated circuits, mixed signal integrated circuits, power integrated circuits, memory circuits, integrated passives, etc.

In one example, the semiconductor chips may be included in a chip scale package (CSP). That is, the semiconductor devices described herein may include or correspond to such CSP. For example, a package may qualify as a CSP when the area of the package may be not greater than 1.2 times the area of the die (or chip). In addition, it may be a requirement to qualify as a CSP that the CSP corresponds to a single die (or single chip), direct surface mountable package. A CSP may e.g. be a diode or a transistor in a silicon package having a product size smaller than 1 mm². For such product size, more than 50.000 and even up to 600.000 units may be produced from a single wafer. A CSP may particularly include no solder bumps. An interconnect of the CSP to an application may be provided by flat solder pads without solder depot. A unit size of a small CSP may e.g. be about 1.0 mm×0.6 mm, or about 0.6 mm×0.3 mm, or about 0.4 mm×0.2 mm.

The terms "frontside" and "active frontside" of a semiconductor chip may be used herein. These terms may particularly relate to a main face of the semiconductor chip that may include microelectronic components and integrated circuits. Semiconductor chips may be manufactured from semiconductor wafers that may serve as a substrate for microelectronic devices to be built in and over the semiconductor wafer. The integrated circuits may be manufactured by doping, ion implantation, deposition of materials, photolithographic patterning, etc. The manufacturing processes usually may be performed on a specific main surface of the semiconductor wafer which may also be referred to as the "frontside" of the semiconductor wafer. After separating the individual chips from the wafer, the "frontside" of the semiconductor wafer may consequently become the "frontside" of the separated semiconductor chips.

Contrarily, the term "backside" of a semiconductor chip may refer to a main surface of the semiconductor chip that may be arranged opposite to the frontside of the semiconductor chip. The backside of the semiconductor chip may be substantially free of electronic components, i.e. it may substantially consist of semiconductor material. Although the backside of the semiconductor chip may be free of electronic components as specified above, electrical contact pads may be arranged over the backside of the semiconductor chip. The semiconductor chip may include an arbitrary number of side surfaces that may extend from the backside of the semiconductor chip to the frontside of the semiconductor chip.

The semiconductor chips may include one or more "active sides" (or "active surfaces"). In particular, the active area may be arranged over a frontside of a semiconductor chip. That is, an active side of a semiconductor chip may be defined as the physical part of the semiconductor chip including the microelectronic structures or semiconductor structures. For example, an active side may include at least one semiconductor structure, in particular at least one of a diode, a transistor, a fuse, a resistor, a capacitor, etc.

The semiconductor devices and/or semiconductor chips as described herein may include an arbitrary number of electrical contacts. The electrical contacts may be arranged in an arbitrary geometry over the surfaces of the semiconductor chip depending on the type of the considered semiconductor device. In one example, the electrical contacts may be arranged over the frontside and the backside of the semiconductor chip. Such semiconductor chip may e.g. correspond to a power semiconductor chip that may include a drain contact arranged on one side of the semiconductor chip, as well as a source contact and a gate contact arranged over the opposite side of the semiconductor chip. In a further example, the electrical contacts may be exclusively arranged over the frontside of the semiconductor chip. For example, such semiconductor chip may correspond to a discrete semiconductor chip. In one example, an electrical contact may be located directly over an electronic structure of the semiconductor chip such that no further redistribution layer may be required when providing an electrical connection between the electrical contact and the electronic structure. In a further example, the electrical contacts may be connected to the electronic structures via one or more additional redistribution layers.

For example, an electrical contact may include a contact pad, such as e.g. a solder pad, that may be configured to provide an electrical contact to be made with integrated circuits included in the semiconductor device or a semiconductor chip included therein. In one example, a contact pad may be essentially flat such that the semiconductor device may be mounted over a surface of an application (e.g. a Printed Circuit Board (PCB)) via the contact pad (surface mounting). For example, the semiconductor device may be glued or soldered to a PCB via the contact pad.

A contact pad may include one or more layers, each of which may include at least one of a metal and a metal alloy. For example, a contact pad may be applied to the semiconductor material of the semiconductor chip. The layers may be manufactured with any desired geometric shape and any desired material composition. Any desired metal or metal alloy, for example, aluminum, titanium, gold, silver, copper, palladium, platinum, nickel, chromium, vanadium, tungsten, molybdenum, etc., may be used as a material.

The layers need not be homogeneous or manufactured from just one material, i.e. various compositions and concentrations of the materials included in the layers may be possible. In one example, the contact pad may correspond to a plated layer that may include at least one of Ni, NiAu, NiPdAu, Cu, CuSn, etc. In a further example, the contact pad may correspond to a solder including at least one of Sn, SnAg, SnAgCu, etc. The contact pads may have a thickness from about 1 µm (micrometers) or even smaller to about 25 µm (micrometers) or even larger, more particular from about 5 µm (micrometers) to about 20 µm (micrometers). The mentioned materials and dimensions are exemplary and may be modified depending on the considered semiconductor device or an application thereof. Any appropriate technique may be used to manufacture the contact pad or the layers forming the contact pad. For example, an electroless plating process may be used.

The semiconductor devices in accordance with the disclosure may include one or more material layers that may be deposited over or may at least partly encapsulate one or more semiconductor chips that may be included in the semiconductor devices. Such deposited material layer may have a thickness that may be smaller than about 50 µm (micrometers), more particular smaller than about 45 µm (micrometers), more particular smaller than about 40 µm (micrometers), more particular smaller than about 35 µm (micrometers), more particular smaller than about 30 µm (micrometers), more particular smaller than about 25 µm (micrometers), more particular smaller than about 20 µm (micrometers), more particular smaller than about 15 µm (micrometers), more particular smaller than about 10 µm (micrometers), more particular smaller than about 5 µm (micrometers). In addition, such deposited material layer may have a thickness that may be greater than 1 µm (micrometer), more particular greater than about 2 µm (micrometers), more particular greater than about 3 µm (micrometers), more particular greater than about 4 µm (micrometers), more particular greater than about 5 µm (micrometers), more particular greater than about 6 µm (micrometers), more particular greater than about 7 μm (micrometers), more particular greater than about 8 μm (micrometers), more particular greater than about 9 μm (micrometers), more particular greater than about 10 μm (micrometers). In general, the thickness of the deposited material layer may lie in a range that may be limited by two arbitrary of the above mentioned values. The term "thickness" of the deposited material layer may particularly correspond to a maximum thickness of the material layer.

The semiconductor devices in accordance with the disclosure may include an arbitrary number of the deposited material layers. Each of the material layers may be manufactured with any desired geometric shape and any desired material composition. The deposited layers may differ in material and/or thickness. Multiple material layers may be arranged in various ways. For example, a first deposited material layer may be arranged over a second deposited material layer. In a further example, two deposited material layers may be arranged adjacent to each other.

The deposited material layer may include at least one of an organic material and a polymer. In one example, the material layer may include a parylene. A material layer including parylene may represent a hydrophobic, chemically resistant coating having barrier properties for inorganic and organic media, acids, caustic solutions, gases, water vapor, etc. Further, such layer may have a low leakage current and a low dielectric constant (e.g. average in-plane and out-of-plane: 2.67 parylene N and 2.5 parylene AF-4, SF, HT). A material layer including parylene may be corrosion resistant and may have a substantially homogeneous surface. The layer may be substantially stable to oxidation up to 350° C. (e.g. parylene AF-4, SF, HT). In addition, the layer may have a low permeability to gases and a low coefficient of friction (e.g. AF-4, HT, SF). Additionally or alternatively, the deposited material layer may include other materials having material properties similar to the ones of parylene.

The deposited material layer may include a paint. A paint may correspond to a liquid, liquefiable or mastic composition which may be converted into a solid film or solid layer after it has been applied to an object. A material layer including paint may be configured to protect, color or provide texture to the object it has been applied to.

The deposited material layer may include a lacquer. A lacquer may correspond to a coating that may include at least one of a resin, a cellular ester, etc., that may be dissolved in a volatile solvent. In addition, a pigment may be added. A lacquer may be a clear or colored synthetic organic coating that may dry to form a material layer by evaporation of a solvent. A lacquer may be produced by dissolving nitrocellulose or other cellulose derivatives together with plasticizers and/or pigments in a mixture of volatile solvents.

The deposited material layer may include a varnish. For example, a varnish may be a combination of a drying oil, a resin, and a thinner or a solvent. A varnish may be transparent and may be free of pigment. After applying a layer of varnish, included film-forming substances may harden as soon as the solvent has evaporated. Alternatively, included film-forming substances may harden after evaporation of the solvent through certain curing processes, for example chemical reaction between oils and oxygen from the air (autoxidation) and/or chemical reactions between components of the varnish. A varnish may e.g. include at least one of resin, shellac, alkyd, spar varnish, drying oils, polyurethane, lacquer, acrylic, etc.

The material layers that may at least partly encapsulate the semiconductor chip(s) of a semiconductor device may be deposited by employing one or more of the various techniques specified in the following.

Methods for manufacturing semiconductor devices in accordance with the disclosure may include one or more vapor deposition processes, for example at least one of a Physical Vapor Deposition (PVD) process, a Chemical Vapor Deposition (CVD) process, etc. For example, the vapor deposition processes may be used for depositing one or more material layers over one or more semiconductor chips. In particular, a vapor deposition process may be configured to deposit a material layer including at least one of an organic layer and a polymer. For example, a vapor deposition process may be used for depositing a material layer including parylene. The vapor deposition processes may be controlled (e.g. via time, pressure, temperature, etc.) such that a material layer of a desired thickness may be obtained.

Physical Vapor Deposition (PVD) may refer to a variety of vacuum deposition processes that may be used to deposit thin films or layers by a condensation of a vaporized form of the film material that is desired to be deposited onto one or more surfaces of an object, such as e.g. a semiconductor chip. A PVD method may particularly involve purely physical processes, such as e.g. high-temperature vacuum evaporation with subsequent condensation, plasma sputter bombardment, etc., rather than involving a chemical reaction at the object that is to be coated. PVD may be practiced in a variety of formats. The present disclosure is not restricted to a specific type of PVD process.

Chemical Vapor Deposition (CVD) may refer to a variety of chemical processes used to produce thin films or layers of a desired material. For example, an object such as e.g. a semiconductor chip may be exposed to one or more volatile precursors that may react and/or decompose on a surface of the object in order to produce the desired deposited layer. CVD may be practiced in a variety of formats. This disclosure is not restricted to a specific type of CVD process.

Methods for manufacturing semiconductor devices in accordance with the disclosure may include one or more spray coating processes, for example at least one of a thermal spraying process, a spray painting process, etc. For example, the spray coating process may be used to deposit one or more material layers over e.g. one or more semiconductor chips. In particular, a spray coating process may be used to deposit a material layer including at least one of a varnish, a lacquer, a paint. The spray coating process may be controlled (e.g. via time, pressure, temperature, etc.) such that a material layer of a desired thickness may be obtained.

Thermal spraying techniques may refer to coating processes in which melted or heated materials may be sprayed over a surface of an object that is to be coated. For example, the coating precursor may be heated by electrical means (e.g. plasma, arc, etc.) or chemical means (e.g. combustion flame, etc.). In general, coating materials available for thermal spraying may include metals, alloys, ceramics, plastics, composites, etc. The coating materials may be fed in powder or wire form, heated to a molten or semi-molten state and may be accelerated towards surfaces of the object to be coated in the form of micrometer-size particles. For example, combustion or electrical arc discharge may be used as a source of energy for thermal spraying. Resulting coatings may be made by an accumulation of numerous sprayed particles. The surface of the object to be coated may not heat up significantly such that a coating of flammable substances may be allowed. Thermal spraying may be practiced in a variety of formats, for example at least one of plasma spraying, detonation spraying, wire arc spraying, flame spraying, high velocity oxy-fuel coating spraying, warm spraying, cold spraying, etc. This disclosure is not restricted to a specific type of thermal spraying.

Spray painting techniques may refer to coating processes in which a coating (e.g. paint, ink, varnish, lacquer, etc.) may be sprayed through the air onto a surface of an object to be coated. Spray painting may be practiced in a variety of formats, and this disclosure is not restricted to a specific type of spray painting. For example, one or more spray nozzles, such as e.g. a single-fluid nozzle, a two-fluid nozzle, etc., may be employed for performing a spray coating process. In a further example, rotary atomizers, ultrasonic atomizers, etc. may be used to perform the spray coating process. In yet a further example, electrostatic charging of sprays may be used.

Methods for manufacturing semiconductor devices in accordance with the disclosure may include one or more dip coating processes. For example, a dip coating process may be used to deposit one or more material layers over one or more semiconductor chips. The dip coating processes may be controlled (e.g. via time, pressure of e.g. a coating material and/or the environment, temperature of e.g. a coating material and/or the environment, etc.) such that a material layer of a desired thickness may be obtained. In particular, a dip coating process may be used to deposit a material layer including at least one of a varnish, a lacquer, a paint.

In dip coating, an object to be coated may be dipped into a coating material or a coating solution and may be pulled out again. After pulling out the object, a film of coating material may be left on the object. The thickness of the obtained film may depend on various factors, for example a temperature of the coating material and the environment, an atmospheric pressure, a humidity of the coating material and the environment, a speed for pulling the object out of the coating material, etc. After coating the object, the film of coating material may be dried and the desired material layer may be formed on the object. During the drying act, a solvent of the coating material may evaporate from the liquid and the coating material may remain on the object as a solid film or solid layer. The coating material into which the object may be dipped is not restricted to liquids. In further examples, the coating material may have the form of a powder, a gel, etc. In one specific example, an object to be coated may be heated to a predetermined temperature that may be smaller than e.g. 100° C. and may be dipped into a coating powder that may melt and cover the object with a desired coating film. Dip coating may be practiced in a variety of formats. The present disclosure is not restricted to a specific type of dip coating.

Methods for manufacturing semiconductor devices in accordance with the disclosure may employ one or more carriers over which one or more semiconductor chips may be at least temporarily arranged. The carriers are not restricted to be manufactured from a specific material and may e.g. have a homogeneous structure. In one example, a carrier may include or may correspond to an electrically insulating substrate. Ina further example, a carrier may include or may correspond to a mechanical fixing layer that may be made of or may include a tape or a foil, e.g. a dicing foil. The mechanical fixing layer may include one or more adhesive surfaces and may be configured to fix semiconductor chips placed over the adhesive surface of the mechanical fixing layer.

FIG. 1 schematically illustrates a cross-sectional view of a semiconductor device 100 in accordance with the disclosure. The semiconductor device 100 may include a semiconductor chip 1. The semiconductor device 100 may further include a material layer 2 that may at least partly encapsulate the semiconductor chip 1. A thickness of the material layer 2 may be smaller than 50 μm (micrometers). The material layer 2 may include at least one of an organic material, a polymer, a varnish, a lacquer, a paint. More detailed semiconductor devices similar to the semiconductor device 100 and methods for manufacturing such semiconductor devices are described below.

Figure 2A:
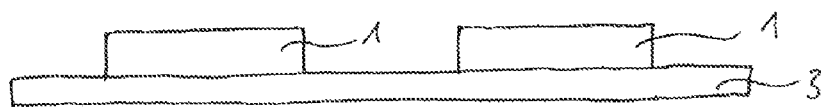
FIGS. 2A to 2B schematically illustrate a cross-sectional view of a method for manufacturing a semiconductor device in accordance with the disclosure.
Figure 2B:
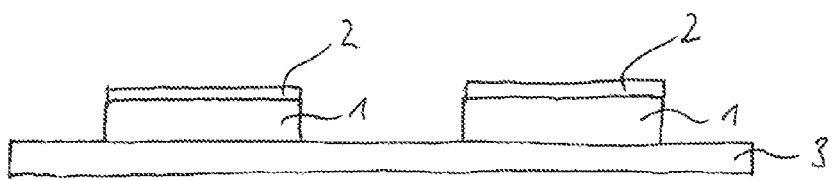

FIGS. 2A to 2B schematically illustrate a cross-sectional view of a method for manufacturing a semiconductor device in accordance with the disclosure. A cross section of a semiconductor device obtained by the described method may become apparent from FIG. 2B. The obtained semiconductor device may be similar to the semiconductor device 100 of FIG. 1. In a first act (see FIG. 2A), multiple semiconductor chips 1 may be arranged over a carrier 3. In a second act (see FIG. 2B), a material layer 2 may be deposited over surfaces of the multiple semiconductor chips 1. Depositing the material layer 2 may include a vapor deposition process. The material layer 2 may include at least one of an organic material and a polymer. The method of FIGS. 2A and 2B may include further acts that are not explicitly illustrated for the sake of simplicity. For example, the multiple semiconductor chips 1 may be separated from the carrier 3 such that individual semiconductor devices may be obtained. More detailed methods for manufacturing semiconductor devices similar to the method of FIGS. 2A to 2B are described below.

Figure 3A:
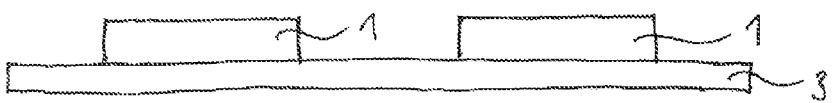
FIGS. 3A to 3B schematically illustrate a cross-sectional view of a method for manufacturing a semiconductor device in accordance with the disclosure.
Figure 3B:

FIGS. 3A to 3B schematically illustrate a cross-sectional view of a method for manufacturing a semiconductor device in accordance with the disclosure. A cross section of a semiconductor device obtained by the method may become apparent from FIG. 3B. The obtained semiconductor device may be similar to the semiconductor devices of foregoing figures. In a first act (see FIG. 3A), multiple semiconductor chips 1 may be arranged over a carrier 3. In a second act (see FIG. 3B), a material layer 4 may be deposited over surfaces of the multiple semiconductor chips 1. Depositing the material layer 4 may include at least one of a dip coating and a spray coating. The material layer 4 may include at least one of a varnish, a lacquer, a paint. The described method may include further acts that are not explicitly illustrated for the sake of simplicity. For example, the multiple semiconductor chips 1 may be separated from the carrier 3 such that individual semiconductor devices may be obtained. More detailed methods for manufacturing semiconductor devices similar to the method of FIGS. 3A and 3B semiconductor devices are described below.

FIGS. 4A to 4G schematically illustrate a method for manufacturing a semiconductor device 400 in accordance with the disclosure, a cross section of which is shown in FIG. 4E. The semiconductor device 400 may be seen as an implementation of further semiconductor devices described herein such that details of the semiconductor device 400 described below may be likewise applied to any of the further semiconductor devices in accordance with the disclosure. In addition, the method shown in FIGS. 4A to 4G may be seen as an implementation of the methods illustrated e.g. in FIGS. 2A to 2B and FIGS. 3A to 3B. Details of the manufacturing method that are described below may therefore be likewise applied to e.g. these methods.

FIG. 4A illustrates multiple semiconductor chips 1 that may be arranged over a carrier 9. In a foregoing act (not illustrated), the semiconductor chips 1 may have been processed (e.g. by forming microelectronic components and integrated circuits on or in the semiconductor chips 1) and separated from a semiconductor wafer. The semiconductor wafer including the semiconductor chips 1 may have been arranged over the carrier 9 and diced into the separated multiple semiconductor chips 1. The semiconductor chips 1 thus may be divided by gaps (or dicing streets) 5 that may be arranged between the individual semiconductor chips 1. Any suitable technique may be used for separating the semiconductor chips 1, for example at least one of sawing, laser dicing, wet etching, plasma etching, etc. For example, the gaps 5 may have a width of about 30 μm (micrometers) (sawing) or smaller (laser dicing, etching). The carrier 9 may be of arbitrary type as described above. In particular, the carrier 9 may correspond to a dicing foil that may include an adhesive layer that may face and fix the semiconductor chips 1.

The semiconductor chips 1 may be of arbitrary types as described above. In the example of FIG. 4A, the semiconductor chips 1 may be similar to each other. In a further example, at least two of the semiconductor chips 1 may differ from each another. In the example of FIG. 4A, an exemplary number of four semiconductor chips 1 is illustrated for the sake of simplicity. In further examples, a different arbitrary number of semiconductor chips 1 may be arranged over the carrier 9 in an arbitrary geometry. For example, the semiconductor chips 1 may be arranged over the carrier 9 in a two-dimensional rectangular pattern.

In the example of FIG. 4A, the semiconductor chips 1 may be arranged over the carrier 9 such that the backsides 6 of the semiconductor chips 1 may face the carrier 9. Consequently, the (active) frontsides 7 of the semiconductor chips 1 that may have been processed before may face away from the carrier 9. For example, the semiconductor chips 1 may include electrical contacts 8 arranged over the active frontsides 7. In the example of FIG. 4A, each semiconductor chip 1 may include two electrical contacts 8 arranged over the frontside 7 of the respective semiconductor chip 1. In further examples, each of the semiconductor chips 1 may include a different arbitrary number of electrical contacts 8 that may be arranged in an arbitrary geometry over the backsides 6 and/or the active frontsides 7 of the semiconductor chips 1. The electrical contacts 8 may be of arbitrary types as described above. The electrical contacts 8 may have a thickness t ranging from about 1 μm (micrometer) or even smaller to about 25 μm (micrometers) or even larger, more particular from about 5 μm (micrometers) to about 20 μm (micrometers).

In FIG. 4B, the semiconductor chips 1 may be released from the carrier 9, flipped and arranged over a further carrier 3. The carrier 3 may be of arbitrary type as described above. In particular, the carrier 3 may correspond to a foil. The carrier 3 may be elastic and/or may include an adhesive layer (not explicitly illustrated) facing the semiconductor chips 1. The semiconductor chips 1 may be arranged such that the active frontsides 7 of the semiconductor chips 1 may face the carrier 3. The electrical contacts 8 may be at least partly pressed into the carrier 3 such that the lower surfaces of the electrical contacts 8 and at least a part of the side surfaces of the electrical contacts 8 may be covered by the material of the carrier 3. This may result in a standoff s between the active frontsides 7 of the semiconductor chips 1 and the carrier 3. For example, the standoff s may lie in a range from about zero to about the thickness t of the respective electrical contact 8.

In FIG. 4C, the carrier 3 may be expanded (see arrows) such that distances d between the semiconductor chips 1 may be increased. For example, the carrier 3 may be expanded until the distances d between the semiconductor chips may be greater than or equal to about 30 μm (micrometers).

In FIG. 4D, a material layer 10 may be deposited over surfaces of the semiconductor chips 1. In the example of FIG. 4D, the material layer 10 may be deposited in a conformal manner such that exposed surfaces of the semiconductor chips 1 may be coated uniformly. In the example of FIG. 4D, the semiconductor chips 1 may be completely covered by the material layer 10 except the surfaces of the electrical contacts 8 that may be covered by the material of the carrier 3. In addition, at least parts of the upper surface of the carrier may be covered by the material layer 10 as well. In a further example, the frontsides 7 and the electrical contacts 8 may remain exposed from the material layer 10 when the standoff s is chosen to have a value of about zero.

The material layer 10 may be deposited using one or more of the materials and techniques described above. For example, the material layer 10 may include at least one of an organic material and a polymer and may be deposited using a vapor deposition process. In a further example, the material layer 10 may include at least one of a varnish, a lacquer, a paint and may be deposited using a spray coating process. A maximum thickness of the material layer 10 may be smaller than e.g. about 50 μm (micrometers). In further examples, the maximum thickness may be smaller than one of the values previously specified. In the example of FIG. 4D, only one material layer 10 may be deposited over surfaces of the semiconductor chips 1. In further examples, an arbitrary number of additional layers (not illustrated) may be deposited over the semiconductor chips 1 and/or the material layer 10. The additional layer(s) may be deposited using one or more of the materials and techniques described above.

After depositing the material layer 10, the carrier 3 may be removed such that the coated semiconductor chips 1 may be released from the carrier 3. One of the released semiconductor devices 400 is illustrated in FIG. 4E. The semiconductor device 400 may include the semiconductor chip 1 that may be at least partly covered by the material layer 10. In the example of FIG. 4E, the semiconductor chip 1 may be covered by the material layer 10, except the main surfaces of the electrical contacts 8 and at least parts of the sidewalls of the electrical contacts 8 that have been covered by the material of the carrier 3 during the coating process of FIG. 4D.

FIG. 4F illustrates a further optional act in which the electrical contacts 8 of the semiconductor device 400 may at least partly be covered by an electrically conductive material 11 that may e.g. include a solder material.

FIG. 4G illustrates a component 12, for example a PCB, that may include electrical contacts 13 that may be arranged over an upper side of the component 12. The semiconductor device of FIG. 4F may be mounted over the component 12 such that the electrical contacts 8 of the semiconductor device 400 may be electrically coupled to the electrical contacts 13 of the component 12 via the electrically conductive material 11.

FIGS. 5A to 5F schematically illustrate a method for manufacturing a semiconductor device 500 in accordance with the disclosure, a cross section of which is shown in FIG. 5F. The semiconductor device 500 may be seen as an implementation of further semiconductor devices described herein such that details of the semiconductor device 500 described below may be likewise applied to any of the further semiconductor devices in accordance with the disclosure. In addition, the method shown in FIGS. 5A to 5F may be seen as an implementation of the methods illustrated in FIGS. 2A to 2B and FIGS. 3A to 3B. Details of the manufacturing method that are described below may therefore be likewise applied to these methods.

In FIG. 5A, multiple semiconductor chips 1 may be arranged over a carrier 9. The semiconductor chips 1 and the carrier 9 may be similar to corresponding components of FIG. 4A. Comments made in connection with FIG. 4A may thus also hold true for FIG. 5A. In contrast to FIG. 4A, the semiconductor chips 1 in FIG. 5A may still be included in a semiconductor wafer, i.e. not yet separated or diced from each other. That is, FIG. 5A may show a semiconductor wafer including the semiconductor chips 1 prior to singulation.

In FIG. 5B, a first material layer 14 may be deposited over the upper surfaces 7 of the multiple semiconductor chips 1. The first material layer 14 may e.g. be similar to the material layer 10 of FIG. 4D. Comments with regard to used materials and deposition techniques made in connection with FIG. 4D may thus also hold true for FIG. 5B. In the example of FIG. 5B, the upper surface and the side surfaces of the semiconductor wafer may be completely covered by the first material layer 14. In further examples, the material layer 14 may be deposited selectively.

In FIG. 5C, at least a part of the first material layer 14 may be removed such that at least the upper surfaces of the electrical contacts 8 may be exposed from the deposited material 14. Any suitable technique may be employed for at least partly removing the first material layer 14 and exposing the electrical contacts 8. In one example, a grinding technique may be applied. Additional or alternative processes for removing the material layer 14 may use a plasma and/or a laser.

In FIG. 5D, the semiconductor chips 1 may be separated from each other, for example by a dicing process. In addition, the semiconductor chips 1 may be released from the carrier 9, flipped and arranged over a further carrier 3. The act of FIG. 5D may at least partly correspond to the act of FIG. 4B. Comments made in connection with FIG. 4B may thus also hold true for FIG. 5D.

In FIG. 5E, a second material layer 15 may be deposited over surfaces of the semiconductor chips 1. The act of FIG. 5E may at least partly correspond to the act of FIG. 4D. Comments made in connection with FIG. 4D may thus also hold true for FIG. 5E. In the example of FIG. 5E, the second material layer 15 may be deposited in a non-conformal manner such that only the exposed backsides 6 and the side surfaces of the semiconductor chips 1 may be coated with the second material layer 15. In a further example, the second material layer 15 may be deposited in a conformal manner such that all surfaces of the semiconductor chips 1 may be coated uniformly. That is, the second material layer 15 may be deposited over the exposed backsides 6 and the exposed side surfaces of the semiconductor chips 1 and may further be deposited over the first material layer 14 that may have been deposited in the foregoing act of FIG. 5B. The second material layer 15 may be deposited using one or more of the materials and techniques described above.

After depositing the second material layer 15, the carrier 3 may be removed such that the coated semiconductor chips 1 may be released from the carrier 3. One of the released semiconductor devices 500 is illustrated in FIG. 5F. The semiconductor device 500 may include the semiconductor chip 1 at least partly covered by the material layers 14 and 15. In the example of FIG. 5F, the backside 6 and the side surfaces of the semiconductor chip 1 may be covered by the second material layer 15 while the frontside 7 of the semiconductor chip 1 and at least parts of the side surfaces of the electrical contacts 8 may be covered by the first material layer 14. In further examples, the material layers 14 and 15 may be arranged in arbitrary other geometries relative to each other. For example, one of the material layers 14, 15 may at least partly cover the respective other material layer 14, 15. The main surfaces of the electrical contacts 8 may remain exposed from the deposited materials.

The method described in connection with FIGS. 5A to 5F may include further acts that are not explicitly illustrated herein for the sake of simplicity. For example, the described method may be extended by one or both of the acts that have been described in connection with FIGS. 4F and 4G.

Figure 6A:
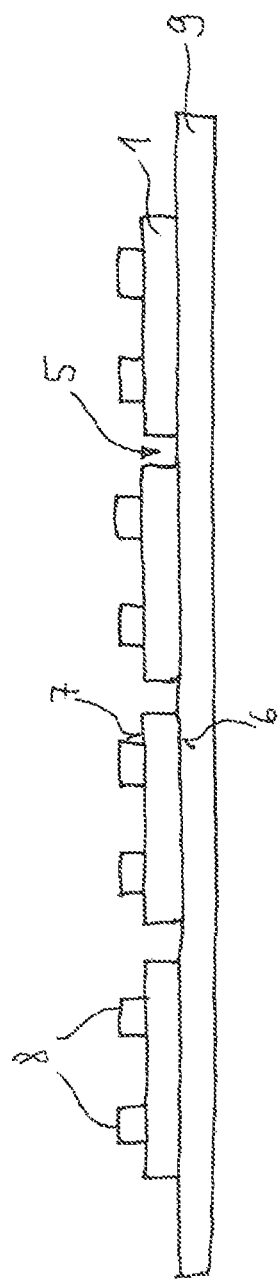
FIGS. 6A to 6E schematically illustrate a cross-sectional view of a method for manufacturing a semiconductor device in accordance with the disclosure.
Figure 6B:
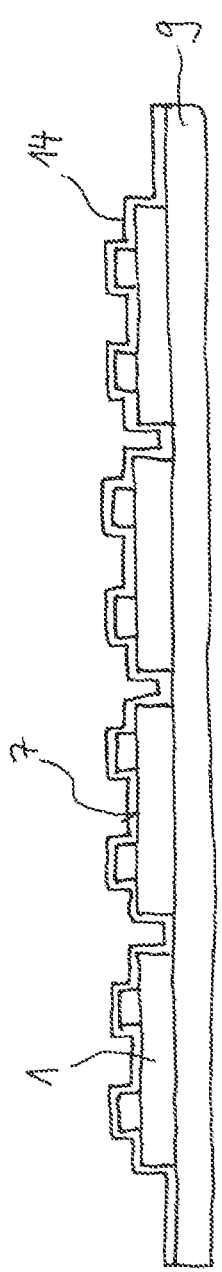
Figure 6C:
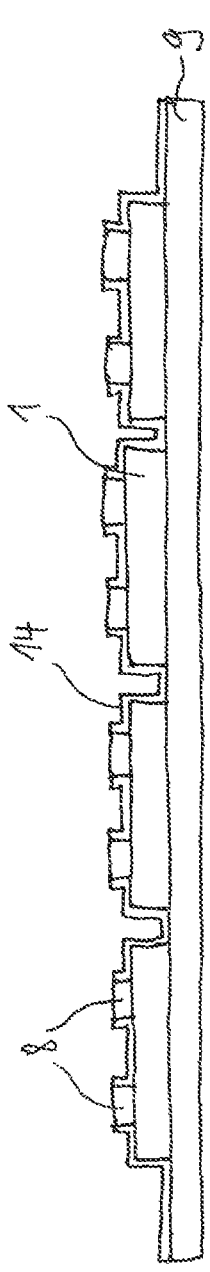
Figure 6D:
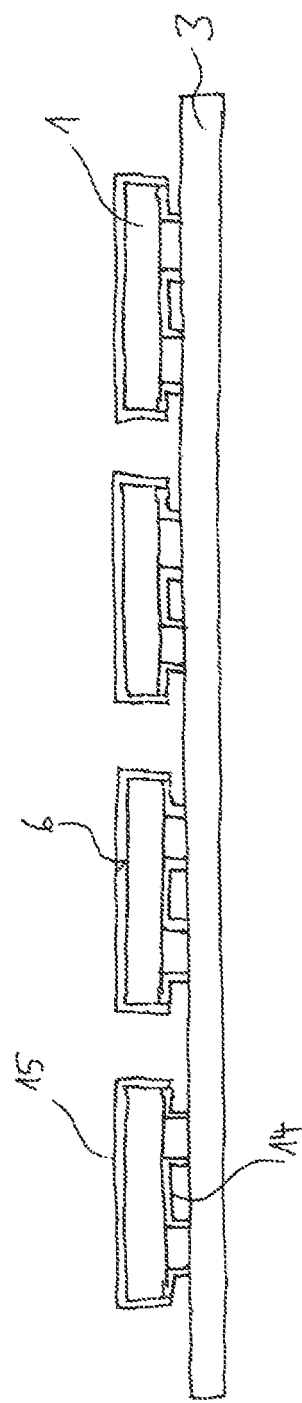
Figure 6E:
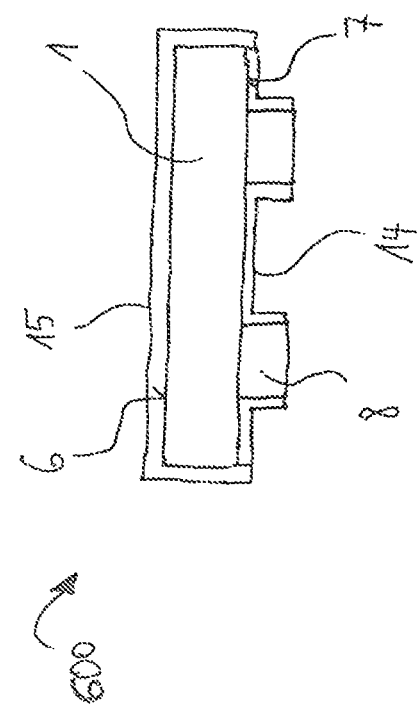

FIGS. 6A to 6E schematically illustrate a method for manufacturing a semiconductor device 600 in accordance with the disclosure, a cross section of which is shown in FIG. 6E. The semiconductor device 600 may be seen as an implementation of further semiconductor devices described herein such that details of the semiconductor device 600 described below may be likewise applied to any of the other semiconductor devices in accordance with the disclosure. In addition, the method shown in FIGS. 6A to 6E may be seen as an implementation of the methods illustrated in FIGS. 2A to 2B and FIGS. 3A to 3B. Details of the manufacturing method that are described below may therefore be likewise applied to these methods.

In FIG. 6A, multiple semiconductor chips 1 may be arranged over a carrier 9. The semiconductor chips 1 and the carrier 9 may be similar to corresponding components of FIG. 4A. Hence, comments made in connection with FIG. 4A may also hold true for FIG. 6A. Similar to FIG. 4A, the semiconductor chips 1 may have already been separated from each other (e.g. by a dicing process) such that gaps 5 may be arranged between the semiconductor chips 1. In one example, the gaps 5 may correspond to dicing streets having a width that may be smaller or equal than about 30 µm (micrometers). In a further example, the gaps 5 may have been further enlarged (e.g. after a dicing process) by expanding the carrier 9 in a horizontal direction such that a width of the gaps 5 may become greater than about 30 µm (micrometers).

In FIG. 6B, a first material layer 14 may be deposited over the upper surfaces 7 of the multiple semiconductor chips 1 and over the carrier 9 at the positions of the gaps 5. For example, the first material layer 14 may be similar to the first material layer 14 of FIG. 5B. Comments made in connection with FIG. 5B may thus also hold true for FIG. 6B. In the example of FIG. 6B, the upper surfaces 7 and the side surfaces of the semiconductor chips 1 as well as the carrier 9 at the positions of the gaps 5 may be covered by the first material layer 14.

In FIG. 6C, at least a part of the first material layer 14 may be removed such that at least the upper surfaces of the electrical contacts 8 may be exposed from the deposited material 14. The act of FIG. 6C may at least partly correspond to the act of FIG. 5C. Comments made in connection with FIG. 5C may thus also hold true for FIG. 6C.

In FIG. 6D, the carrier 9 may be removed such that the semiconductor chips 1 may be released from the carrier 9. The released semiconductor chips 1 may be flipped and arranged over a further carrier 3. The act of FIG. 6D may at least partly correspond to the act of FIG. 5D. Comments made in connection with FIG. 5D may thus also hold true for FIG. 6D. In addition, a second material layer 15 may be deposited over surfaces of the semiconductor chips 1. The act of FIG. 6D may at least partly correspond to the act of FIG. 5E. Comments made in connection with FIG. 5E may thus also hold true for FIG. 6D.

After depositing the second material layer 15, the carrier 3 may be removed such that the coated semiconductor chips 1 may be released from the carrier 3. One of the released semiconductor devices 600 is illustrated in FIG. 6E. The semiconductor device 600 may e.g. be similar to the semiconductor device 500 of FIG. 5F. Comments made in connection with FIG. 5F may thus also hold true for FIG. 6E.

The method described in connection with FIGS. 6A to 6E may include further acts that are not explicitly illustrated herein for the sake of simplicity. For example, the described method may be extended by one or both of the acts that have been described in connection with FIGS. 4F and 4G.

Figure 7A:
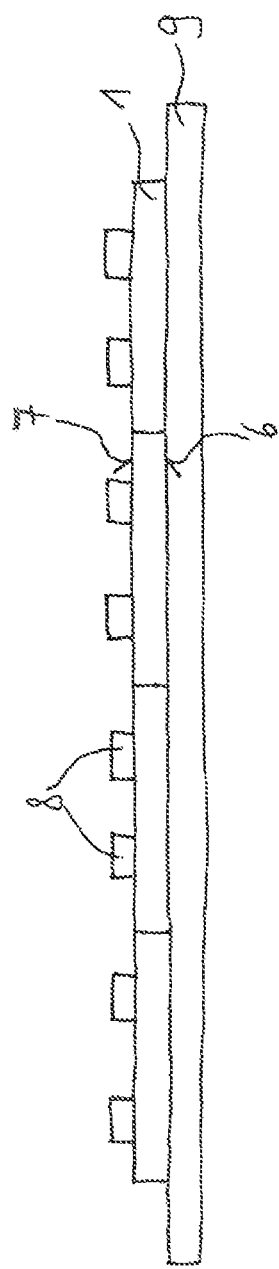
FIGS. 7A to 7F schematically illustrate a cross-sectional view of a method for manufacturing a semiconductor device in accordance with the disclosure.
Figure 7B:
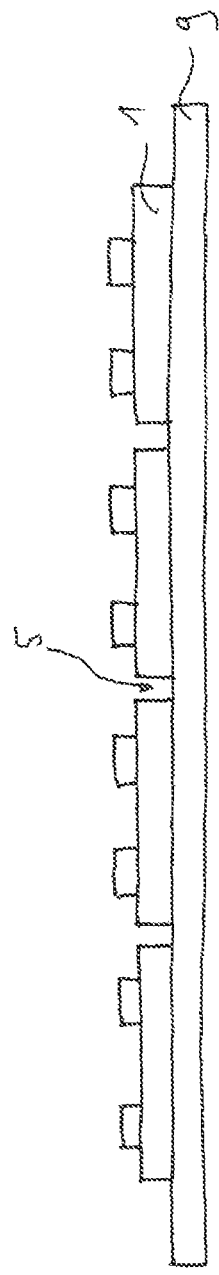
Figure 7C:
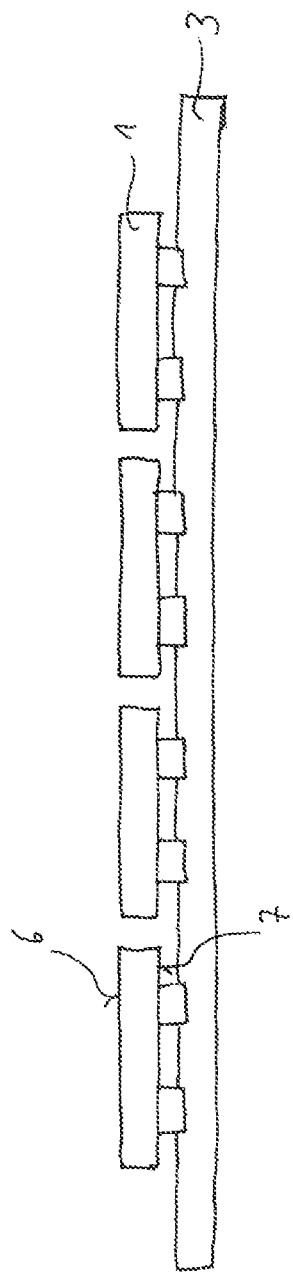
Figure 7D:
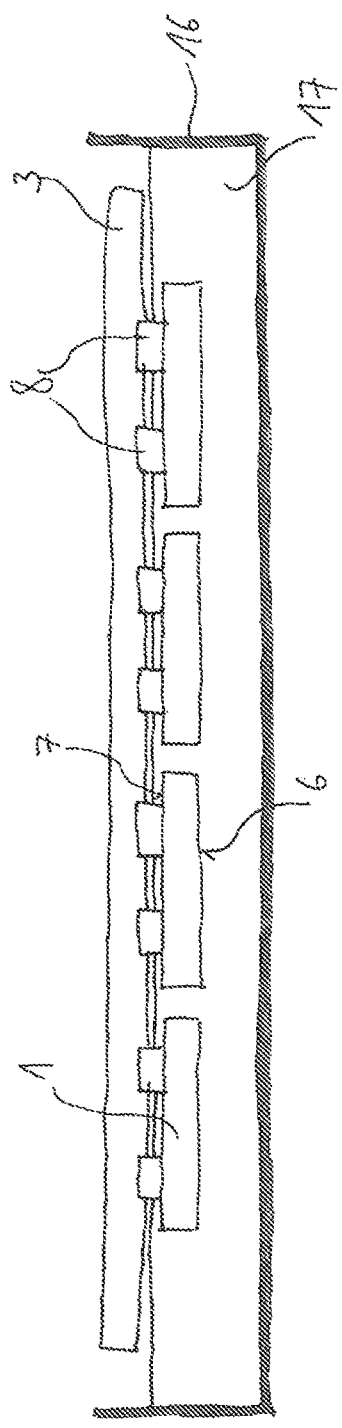
Figure 7E:
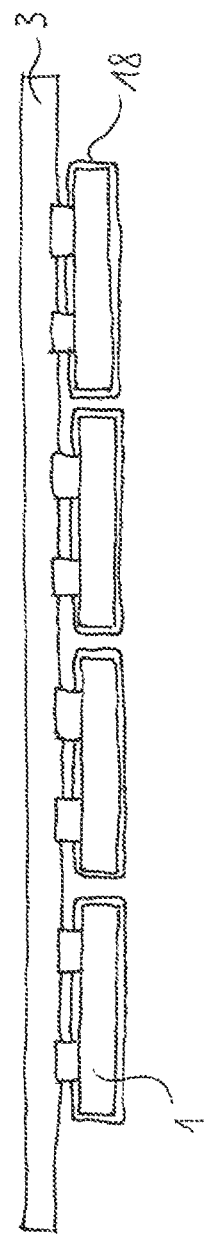
Figure 7F:
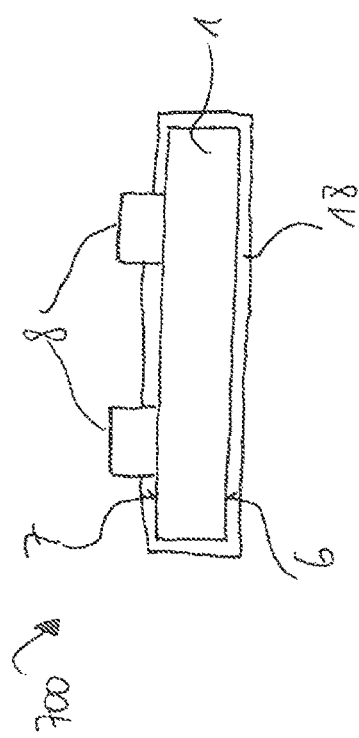

FIGS. 7A to 7F schematically illustrate a method for manufacturing a semiconductor device 700 in accordance with the disclosure, a cross section of which is shown in FIG. 7F. The semiconductor device 700 may be seen as an implementation of further semiconductor devices described herein such that details of the semiconductor device 700 described below may be likewise applied to any of the other semiconductor devices in accordance with the disclosure. In addition, the method shown in FIGS. 7A to 7F may be seen as an implementation of the methods illustrated in FIGS. 2A to 2B and FIGS. 3A to 3B. Details of the manufacturing method that are described below may therefore be likewise applied to these methods.

In FIG. 7A, a semiconductor wafer including multiple semiconductor chips 1 may be arranged over a carrier 9. In FIG. 7B, the semiconductor chips 1 may be separated from each other, for example by a dicing process. The acts of FIGS. 7A and 7B may at least partly correspond to the act of FIG. 4A. Comments made in connection with FIG. 4A may thus also hold true for FIGS. 7A and 7B.

In FIG. 7C, the semiconductor chips 1 may be released from the carrier 9, may be flipped and may be arranged over a further carrier 3. The act of FIG. 7C may at least partly correspond to the act of FIG. 4B. Comments made in connection with FIG. 4B may thus also hold true for FIG. 7C.

In FIG. 7D, the carrier 3 including the semiconductor chips 1 may be flipped and arranged such that the semiconductor chips 1 may be at least partly dipped into a reservoir 16 containing a coating material 17. In the example of FIG. 7D, the semiconductor chips 1 may be dipped into the coating material 17 such that the backsides 6, the frontsides 7 and the side surfaces of the semiconductor chips 1 may be covered by the coating material 17. In addition, the side surfaces of the electrical contacts 8 may at least partly be covered by the coating material 17. A standoff may be provided between the carrier 3 and the upper surface of the coating material 17 such that the side surfaces of the electrical contacts 8 may at least partly remain exposed from the coating material 17 in one example.

Any of the dip coating techniques and coating materials described above may be used in connection with the act of FIG. 7D. In particular, the coating material 17 may include at least one of a varnish, a lacquer, a paint, etc. The coating material 17 may have the form of a liquid, a powder, a gel, etc.

In FIG. 7E, the carrier 3 may be lifted such that the semiconductor chips 1 may be pulled out of the coating material 17. Apart of the coating material 17 may remain over the surfaces of the semiconductor chips 1 at the locations where the semiconductor chips 1 have been dipped into the coating material 17. In particular, the remaining coating material 17 may have the form of a material film or a material layer 18 that may become solid. For example, the material layer 18 may be similar to previously described deposited material layers. In the example of FIG. 7E, the material layer 18 may have a substantially uniform thickness. In a further example, the material layer 18 may have different thicknesses at different locations. For example, such non-uniform thicknesses may occur when different parts of the semiconductor chips 1 are dipped into the coating material 17 based on different times, pressures, temperatures, etc.

After depositing the material layer 18, the carrier 3 may be removed such that the coated semiconductor chips 1 may be released from the carrier 3. One of the released semiconductor devices 700 is illustrated in FIG. 7F. The semiconductor device 700 may be similar to previously described semiconductor devices in accordance with the disclosure. The semiconductor device 700 may include the semiconductor chip 1 at least partly covered by the material layer 18. In the example of FIG. 7F, the backside 6, the frontside 7 and the side surfaces of the semiconductor chip 1 may be covered by the material layer 18. In addition, the main surfaces of the electrical contacts 8 may at least partly be exposed from the material layer 18. In further examples, the arrangement and geometry of the material layer 18 may be different and may particularly depend on how deep the semiconductor chips 1 have been dipped into the coating material 17 in the act of FIG. 7D.

The method described in connection with FIGS. 7A to 7F may include further acts that are not explicitly illustrated herein for the sake of simplicity. For example, further dip coating processes may be performed in order to deposit further layers over the surfaces of the semiconductor chips 1 and/or the material layer 18. In addition, the described method may be extended by one or both of the acts described in connection with FIGS. 4F and 4G.

The methods in accordance with the disclosure as described above may include a deposition of material layers over multiple semiconductor chips that may be separated from each other during the deposition act. In further examples, assembled semiconductor chips or combinations of semiconductor chips may be covered by the material layers. For example, material layers may be deposited over stacked semiconductor chips or semiconductor chips that may be mechanically and/or electrically connected with each other in an arbitrary fashion.

The acts described in connection with the methods specified herein may be combined in an arbitrary manner, if reasonable from a technical point of view. In one example, the backsides and at least a part of the side surfaces of multiple semiconductor chips may be covered by a first material layer by using a dip coating process as e.g. described in connection with FIGS. 7A to 7F while at least a part of the side surfaces and the frontsides of the multiple semiconductor chips may be covered with a second material layer using a spray coating process and/or a vapor deposition process. In a further example, multiple dip coating processes may be used for depositing multiple material layers. It is understood that the number of further possible methods in accordance with the disclosure that may result from further combinations of the acts described herein may be too numerous to be explicitly described in this specification.

The semiconductor devices in accordance with the disclosure and the methods for manufacturing such semiconductor devices may have the following effects. The listed effects are neither exclusive nor limiting.

The methods in accordance with the disclosure may represent batch processes in which multiple semiconductor chips or multiple semiconductor wafers may be processed at the same time. Compared to other methods for manufacturing semiconductor devices, the methods in accordance with the disclosure may be simplified and more cost effective.

Compared to other methods for manufacturing semiconductor devices, the methods in accordance with the disclosure may provide the possibility of coating semiconductor chips directly after the semiconductor chips have been separated from the semiconductor wafer, for example directly after a dicing process.

Compared to other methods for manufacturing semiconductor devices, the methods in accordance with the disclosure may provide deposited material layers that may be configured to protect the encapsulated semiconductor chips from undesired environmental influences.

The deposited material layers may be used for marking semiconductor chips without substantially damaging the semiconductor material.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

What is claimed is:

1. A method, comprising:
    arranging multiple semiconductor chips over a first temporary carrier, wherein active frontsides of the semiconductor chips face the first temporary carrier, wherein front surfaces of electrical contacts arranged on the active frontsides of the semiconductor chips face the first temporary carrier and are covered by the material of the first temporary carrier, and wherein gaps between the active frontsides of the semiconductor chips and the first temporary carrier are provided;
    depositing a first material layer over the active frontsides of the multiple semiconductor chips, wherein depositing the first material layer comprises a vapor deposition, and wherein the first material layer comprises at least one of an organic material and a polymer;
    releasing the e semiconductor chips from the first temporary carrier, wherein the front surfaces of the electrical contacts and side surfaces of the electrical contacts are exposed from the first material layer, wherein the side surfaces of the electrical contacts extend from the active frontsides of the semiconductor chips to the front surfaces of the electrical contacts;
    controlling the vapor deposition such that a thickness of the deposited first material layer is smaller than 50 micrometers; and
    covering the exposed front surfaces of the electrical contacts with a solder material.

2. The method of claim 1, wherein the first material layer comprises a parylene.

3. The method of claim 1, wherein the multiple semiconductor chips are arranged over the first carrier such that active frontsides of the semiconductor chips face the first carrier.

4. The method of claim 1, further comprising:
    before arranging the multiple semiconductor chips over the first carrier, arranging the multiple semiconductor chips over a second carrier such that backsides of the multiple semiconductor chips face the second carrier; and
    depositing a second material layer over active frontsides of the multiple semiconductor chips.

5. The method of claim 4, wherein depositing the second material layer comprises a vapor deposition, and wherein the second material layer comprises at least one of an organic material and a polymer.

6. The method of claim 4, wherein depositing the second material layer comprises at least one of a dip coating and a spray coating, and wherein the material layer comprises at least one of a varnish, a lacquer and a paint.

7. The method of claim 4, further comprising:
    before depositing the second material layer, providing gaps between the multiple semiconductor chips.

8. The method of claim 4, further comprising:
    removing the deposited second material layer at least partly from electrical contacts arranged over the active frontsides of the multiple semiconductor chips.

9. The method of claim 1, wherein the electrical contacts are pressed into the material of the first temporary carrier, wherein the side surfaces of the electrical contacts are covered by the material of the first temporary carrier.

10. The method of claim 1, wherein at least a part of the gaps between the active frontsides of the semiconductor chips and the first temporary carrier remains unfilled by the first material layer.

11. A method, comprising:
    arranging multiple semiconductor chips over a first temporary carrier, wherein active frontsides of the semiconductor chips face the first temporary carrier, wherein front surfaces of electrical contacts arranged on the active frontsides of the semiconductor chips face the first temporary carrier and are covered by the material of the first temporary carrier, and wherein gaps between the active frontsides of the semiconductor chips and the first temporary carrier are provided;
    depositing a first material layer over the active frontsides of the multiple semiconductor chips, wherein depositing the material layer comprises at least one of a dip coating and a spray coating, wherein the material layer comprises at least one of a varnish, a lacquer and a paint;
    releasing the multiple semiconductor chips from the first temporary carrier, wherein the front surfaces of the electrical contacts and side surfaces of the electrical contacts are exposed from the first material layer, wherein the side surfaces of the electrical contacts extend from the active frontsides of the semiconductor chips to the front surfaces of the electrical contacts;

controlling the deposition of the first material layer such that a thickness of the deposited first material layer is smaller than 50 micrometers; and covering the exposed front surfaces of the electrical contacts with a solder material.

12. The method of claim 11, wherein depositing the first material layer comprises a dip coating, and wherein the dip coating comprises dipping the multiple semiconductor chips into at least one of a liquid, a powder and a gel.

13. A semiconductor device comprising:

a semiconductor chip comprising an active surface, wherein an electrical contact element of the active surface comprises an exposed peripheral surface facing away from the active surface, wherein the electrical contact comprises an electrical contact arranged over the active surface and a solder material arranged over the electrical contact, wherein each of the electrical contact and the solder material comprises an exposed peripheral surface; and a first material layer at least partly encapsulating the semiconductor chip, wherein a thickness of the first material layer is smaller than 50 micrometers, and wherein the first material layer comprises at least one of an organic material, a polymer, a varnish, a lacquer, and a paint.

14. The semiconductor device of claim 13, wherein the first material layer comprises a parylene.

15. The semiconductor device of claim 13, wherein an active frontside of the semiconductor chip is exposed from the first material layer.

16. The semiconductor device of claim 13, wherein a surface area of an active frontside of the semiconductor chip is smaller than 1 $mm^2$.

17. The semiconductor device of claim 13, wherein the first material layer is arranged over a backside of the semiconductor hip and over a side surface of the semiconductor chip.

18. The semiconductor device of claim 13, further comprising:

a second material layer at least partly encapsulating the semiconductor chip, wherein a thickness of the second material layer is smaller than 50 micrometers, and wherein the second material layer comprises at least one of an organic material, a polymer, a varnish, a lacquer, and a paint.

19. The semiconductor device of claim 18, wherein the second material layer is arranged over an active frontside of the semiconductor chip.

20. The semiconductor device of claim 18, wherein the second material layer is arranged over the first material layer.

21. The semiconductor device of claim 13, wherein the first material layer covers a side surface of the electrical contact, wherein the side surface extends from the active surface of the semiconductor chip to the exposed peripheral surface of the electrical contact.

\* \* \* \* \*

UNITED STATES PATENT AND TRADEMARK OFFICE
CERTIFICATE OF CORRECTION

| | | |
|---|---|---|
| PATENT NO. | : 9,576,872 B2 | Page 1 of 1 |
| APPLICATION NO. | : 14/132296 | |
| DATED | : February 21, 2017 | |
| INVENTOR(S) | : T. Mueller et al. | |

It is certified that error appears in the above-identified patent and that said Letters Patent is hereby corrected as shown below:

Column 18, Line 6 (Claim 17, Line 3) please change "hip and" to -- chip and --

Signed and Sealed this
Sixth Day of June, 2017

Michelle K. Lee
*Director of the United States Patent and Trademark Office*